United States Patent
Kulkarni et al.

(10) Patent No.: US 9,983,641 B2
(45) Date of Patent: May 29, 2018

(54) TUNABLE TWO PHASE LIQUID COOLING THERMAL MANAGEMENT METHOD AND APPARATUS

(71) Applicant: Intel Corporation, Santa Clara, CA (US)

(72) Inventors: Devdatta P. Kulkarni, Olympia, WA (US); Timothy G. Hanna, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/140,014

(22) Filed: Apr. 27, 2016

(65) Prior Publication Data

US 2017/0315595 A1    Nov. 2, 2017

(51) Int. Cl.
    *G06F 1/20*    (2006.01)
    *H01L 35/00*   (2006.01)
    *H01L 21/00*   (2006.01)
    *H01L 37/00*   (2006.01)

(52) U.S. Cl.
    CPC .............. *G06F 1/20* (2013.01); *H01L 35/00* (2013.01); *H01L 21/00* (2013.01); *H01L 37/00* (2013.01)

(58) Field of Classification Search
    CPC . G06F 1/20; H01L 21/00; H01L 35/00; H01L 37/00
    USPC .................. 361/679.47; 62/3.2; 297/180.12
    See application file for complete search history.

(56) References Cited

U.S. PATENT DOCUMENTS

| 6,093,001 | A  | * | 7/2000 | Burgreen | A61M 1/101 415/176 |
| 6,345,507 | B1 | * | 2/2002 | Gillen | F25B 21/04 136/203 |
| 2005/0147500 | A1 | * | 7/2005 | Sauciuc | F25B 49/02 417/52 |
| 2013/0199208 | A1 | * | 8/2013 | Shi | F25B 21/02 62/3.2 |
| 2014/0071626 | A1 | * | 3/2014 | Campbell | B23P 15/26 361/700 |

OTHER PUBLICATIONS

U.S. Appl. No. 15/199,003, filed Jun. 30, 2016, and entitled "Heat Transfer Apparatus for a Computer Environment".

* cited by examiner

*Primary Examiner* — Dion R Ferguson
*Assistant Examiner* — Mandeep S Buttar
(74) *Attorney, Agent, or Firm* — Schwabe, Williamson & Wyatt, P.C.

(57) ABSTRACT

Methods, apparatuses, and systems associated with tunable pumped two-phase liquid cooling thermal management are disclosed. In embodiments, a tunable cooling apparatus may include a thermoelectric cooler device, TEC, that has a hot side and a cold side, where the cold side is to cool the coolant in route to an inlet manifold of the cold plate before the coolant enters the inlet manifold, and the hot side may be to warm the coolant in route from an outlet manifold of the cold plate after the coolant flows through the cold plate and exits the outlet manifold and or vice versa. In embodiments, the coolant may be either in a liquid state or in a vapor state. Other embodiments may be described and/or claimed.

18 Claims, 9 Drawing Sheets

US 9,983,641 B2

TUNABLE TWO PHASE LIQUID COOLING THERMAL MANAGEMENT METHOD AND APPARATUS

FIELD

Embodiments of the present disclosure generally relate to the field of computing systems. More specifically, embodiments of the present disclosure relate to cooling electronic components in a computing system.

BACKGROUND

As electronic components decrease in size and increase in the power requirements, cooling individual components as well as collections of components will become even more important to ensure proper computing system function moving forward. For example, the size of central processing unit (CPU) dies are miniaturizing at the same time the number of cores, heat dissipation, and thermal design power (TDP) of these dies are increasing. This can result in a higher heat flux from the CPU dies and increases the challenge for thermally managing the CPU. This may be a challenge for legacy cooling solutions to achieve operational performance goals with new components, as system architects seek to lower junction die temperatures in product segments such as desktops, workstations or servers.

Legacy air cooled reference platforms are typically built per American Society of Heating, Refrigerating and Air-Conditioning Engineers (ASHRAE) Class A2. In legacy implementations to support high power dense solutions, liquid-enhanced solutions are typically used where components are cooled by liquid cold plates, and heat is dissipated to the outside air via heat exchangers (HEX) located inside the computer chassis. If the system boundary conditions change, for example if inlet air temperature increases or if workload increases due to turbo operation or overclocking, a CPU may need to be cooled further. In addition, in some legacy systems with multiple components to thermally manage, air or single-phase liquid cooling may be used to cool cold plates connected in series or parallel to cool multiple components. In practice, the second cold plate in the cooling series will be hotter than the first cold plate in the cooling series.

BRIEF DESCRIPTION OF THE DRAWINGS

In embodiments, an advanced, tunable thermal management system may address these problems, and more. In embodiments, the system may be adapted as a universal cooling solution. One non-limiting example is air cooling with in-situ extra cooling as needed. The design of cold plates and systems may be easily changed and adapted to very high thermal requirements by implementing embodiments of the system. In non-limiting examples, processors may be upgraded from one generation to the next generation having greater performance and greater thermal management requirements, with minimal changes in form factor of the cooling system. Embodiments of this thermal management system may enable the mixing of the different types of processors at rack and system levels as well. Using embodiments of the disclosed systems, a module packaging engineer may have smaller, lighter and better thermally performing tools to help get all of the module heat to the rear of the box, when using a closed aluminum refrigerant loop. Embodiments of this thermal management solution may be fitted to desktops, tablets, servers, micro servers, etc. Also, being tunable, energy used for thermal management may be minimal and may be used on an as-needed basis.

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
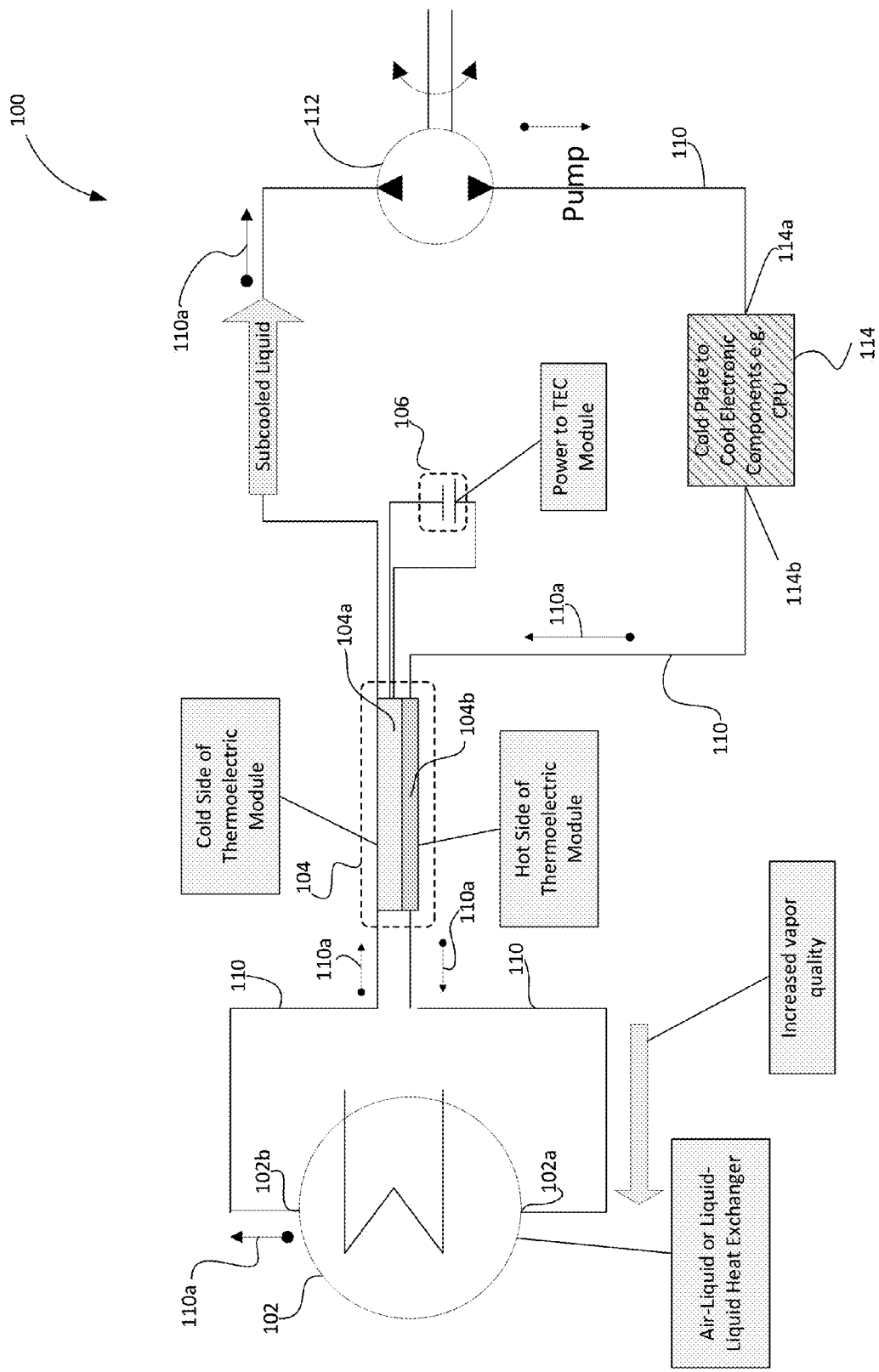
FIG. 1 is a diagram of a tunable pumped two-phase liquid cooling thermal management system, in accordance with some embodiments.

Processes, apparatuses, and systems associated with tunable pumped two-phase liquid cooling thermal management are disclosed herein. In embodiments, a tunable cooling apparatus may include a thermoelectric module, TEM, that may have a hot side and a cold side, where the cold side may be to cool the coolant in route to an inlet manifold of the cold plate before the coolant enters the inlet manifold, and the hot side may be to warm the coolant in route from an outlet manifold of the cold plate after the coolant flows through the cold plate and exits the outlet manifold. In embodiments, the coolant may be either in a liquid state or in a vapor state or mixed liquid and gas state. Details of these and/or other embodiments, as well as some advantages and benefits, are disclosed and described herein.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

Various embodiments are disclosed that include advanced, tunable, very high thermal performance pumped two-phase liquid cooling technology that may be used in liquid-enhanced air cooling (LEAC) systems as well as fully liquid cooled systems, to moderate or cool temperatures of electronic components on a motherboard. In embodiments, various parameters in embodiments of thermal management solutions may be addressed at the same time to achieve central processor unit (CPU) cooling. These parameters may include (1) the heat transfer coefficient on the heat sink or cold plate side, and (2) junction or case temperature on the CPU side.

By lowering the junction temperature, leakage losses may be reduced. By reducing the leakage power on the processor, one can achieve higher performance using the same designated power to the processor. In a non-limiting example, a CPU junction temperature needed to achieve the desired performance may be 75° C. instead of more common 95° C. to 105° C. These temperatures may be achieved by using a microchannel liquid cold plate to cool the CPU. In this example, the effective heat transfer coefficient may be as high as 40,000 W/m$^2$K over the baseplate of the thermal solution attached to the heat sink of the CPU. In this example, any increase in the heat transfer coefficient may not significantly decrease the junction or case temperature much further due to the asymptotic nature. However, the junction temperature may be additionally decreased by lowering the inlet coolant temperature before the coolant reaches the heat transfer mechanism, for example cold plate, that is thermally coupled to the CPU.

An advanced cooling technology is disclosed herein that may use a high heat transfer cooling method such as pumped liquid multiphase cooling (PLMC) and a tunable inlet fluid temperature such as a thermoelectric module (TEM) device. In embodiments, several combinations may be used for real implementations. In embodiments, a liquid-enhanced air cooling (LEAC) solution may be used with PLMC and TEM technologies. Embodiments may include completely liquid cooled implementations using a similar principal.

FIG. 1 is a diagram of a tunable pumped two-phase liquid cooling thermal management system, in accordance with some embodiments. Diagram 100 shows a diagram of an example PLMC LEAC system used to transfer thermal energy from a cold plate 114 using a TEM 104.

In embodiments, PLMC technology may offer a high heat transfer capability due to heat of vaporization, which may require a very small quantity of fluid to dissipate high heat loads. A LEAC implementation may be implemented when air cooling is needed, for example, at the rack or server level or in desktops. However, liquid cooling capabilities may be needed at the CPU or component level in order to achieve target performance of the CPU. A combined PLMC LEAC implementation may use a pump 112 which may operate at very low power, to provide coolant at sub-cooled temperatures that may flow via tubes 110 to one or more cold plates 114. The coolant may take heat from the cold plate 114, which may be thermally coupled to the CPU, and may as a result turn part of the liquid coolant to vapor by heat of vaporization. In embodiments, the liquid/vapor coolant mixture may then be routed to TEM 104, and thereafter pass through a heat exchanger (HEX) 102, which may also be referred to as a condenser, where heat may be dissipated to air, or to liquid depending upon the condenser type. The coolant may then be returned to the pump 112 as a sub-cooled liquid.

In embodiments the coolant in various portions of the system may be in a liquid state, a vapor state, or both. In embodiments, the coolant may be a dielectric or other fluid, for example R134a or Novec™ 7000 by 3M™. In embodiments, using a dielectric fluid may reduce or minimize issues of coolant leaks that may cause unwanted electrical connections or corrosion. In addition, a dielectric fluid may draw lower power as the pump 112 pumps the coolant through the system.

In embodiments, the tunable pumped two-phase liquid cooling thermal management process may result in (1) case temperatures or junction temperatures being lowered by sub-cooling the temperature of the coolant, and/or (2) the HEX 102 (or condenser) thermal performance being increased by increasing the amount of vapor present in the coolant mixture. In embodiments, these results may be achieved by embedding a TEM 104, which may be used for cooling, between the cold plate 114 inlet manifolds 114a and the outlet manifolds 114b. By using a TEM 104, heat may be transferred from the TEM cold side 104a to the TEM hot side 104b by using electrical energy from a TEM electrical source 106.

Diagram 100 shows the TEM cold side 104a may be coupled with the cold plate inlet side 114a. This may lower a sub-cooling temperature to the cold plate 114 to reduce the junction temperature of a CPU (not shown) that is thermally coupled to the cold plate 114. The TEM hot side 104b may be coupled with cold plate outlet side 114b to dissipate heat from the TEM cold side 104a. This heat may increase the quality of the coolant, which may be an indication of an increased amount of vapor in the coolant, at the same saturation temperature, going to the HEX 102. In embodiments, the HEX 102 may also be referred to as a condenser.

In embodiments, as quality (vapor content) of the coolant increases, the HEX 102 thermal performance may increase. In embodiments, segments of the coolant loop may carry more heat than before due to the addition of TEM 104 energy, and the average outlet air temperature from the HEX 102 may increase minimally. This may be due in part to isothermal fluid temperatures in the HEX 102. With a single-phase liquid to air heat exchanger, the air temperature coming out of the heat exchanger may be non-uniform, for example a higher air exit temperature from the heat exchanger located proximate to the coolant inlet 102a and colder air temperature from the heat exchanger located proximate to the coolant outlet 102b. In embodiments of a PLMC implementation, the air exit temperature from the HEX 102 may be more uniform and hence average temperature of the air exiting the HEX 102 (instead of local temperature) may increase by only a very small amount. This is mainly due to the dissipation of latent heat of the fluid to the air. An isothermal liquid and vapor front moves from HEX inlet to outlet and dissipate fluid heat to air at same temperature. In single-phase liquid cooling, the heat dissipation from fluid is carried out by specific heat of fluid.

In embodiments, case temperature and/or the junction temperature may be tuned using the tunable pumped two-phase liquid cooling thermal management process. In embodiments, energy in the TEM 104 may be directly controlled by varying the power source 106 to the TEM 104. In embodiments, the power source 106 may be direct-current (DC). The power source 106 may be controlled using input from one or more temperature sensors (not shown). In a non-limiting example, sensors may indicate the temperature of a CPU, some other component, ambient temperature, coolant temperature in a particular segment, and/or quality (vapor content) of the coolant. Embodiments may include initialization or reset periods to determine proper time constants for tuning TEM 104 energy. In embodiments, TEM 104 energy tuning may be used for thermal management when ambient temperatures are high, or CPUs are operating in turbo mode or overclocked.

In embodiments, coolant may flow to the HEX 102 by entering HEX coolant inlet 102a, and leave from HEX coolant outlet 102b. In embodiments, the coolant will be at a higher temperature as it enters the HEX 102 than the coolant is as it exits the HEX 102. In embodiments, the coolant may flow through tubes 110.

In embodiments, the coolant may leave the HEX at coolant outlet 102b, and flow to the TEM 104. The TEM 104 may have a first side 104a and a second side 104b. In some embodiments, the TEM first side 104a may be a cold side and the TEM second side 104b may be a hot side. In other embodiments, the TEM first side 104a may be a hot side, and the TEM second side 104b may be a cold side, as discussed below for FIG. 8.

In embodiments, the coolant, as it leaves the HEX 102 through coolant outlet 102b and flows to the TEM 104, may be thermally coupled to the TEM first side 104a. In embodiments, thermal coupling may be achieved by the coolant coming into contact with the tube 110, which may be in physical contact with the TEM first side 104a. In embodiments, other processes for heat exchange may be used to provide the thermal connection between the coolant and the TEM 104.

In embodiments where the TEM first side 104a is the cold side, the coolant leaving the TEM 104 may be subcooled coolant that is at a lower temperature than it was before reaching the TEM first side 104a.

A pump 112, as described earlier, may be used to pump the coolant to a cold plate 114. In embodiments, the pump 112 may be of varying speed and may be controlled by a control unit (not shown). The pump 112 may use a diaphragm, impeller, rotor, or any other suitable technology to pump the coolant. In embodiments, the pump 112 may be placed at any point within the tube 110 structure to facilitate the flow of the coolant in the direction 110a. In embodiments, the pump 112 resides between the TEM cold side 104a and the cold plate 114.

In embodiments, the cold plate 114 may be used to cool electronic components which, in non-limiting examples, may be a CPU, memory, or any other component from which thermal energy may be conducted through a thermal coupling between the component and the coolant. In embodiments, cold plate 114 may be used to transfer thermal energy between the coolant in tube 110, ambient air or other ambient substances in proximity to the component. In embodiments, thermal coupling may be achieved by the coolant being thermally coupled with the tube 110, which may in turn may be thermally coupled with the TEM first side 104a. In embodiments, other processes for heat exchange may be used to provide the thermal connection.

In embodiments, coolant leaving the cold plate 114 may flow in a direction 110a to the TEM second side 104b. In embodiments, the coolant leaving the cold plate 114 may be warmer than the coolant entering the cold plate 114, which may result in the coolant becoming warmer coolant liquid, warmer coolant vapor, and/or an increase in the quality (amount of vapor as a percent of liquid).

In embodiments, coolant may then leave the cold plate 114 and may travel to the TEM second side 104b, and become thermally coupled to the TEM second side 104b. In embodiments where the TEM second side 104b is a hot side, the coolant leaving the TEM 104 may be heated coolant that is at a higher temperature and/or may have a higher vapor content compared to the coolant before it reached the TEM second side 104b. In embodiments, the coolant may then flow to the HEX coolant inlet 102a.

In embodiments, the TEM 104 may be connected to a thermoelectric cooling power source 106 used to operate the TEM 104. In embodiments, variations in the power from the power source 106 may tune and change performance characteristics of the TEM 104, including but not limited to changes in temperature of the first side 104a and of the second side 104b, the temperature differential between the first side 104a and the second side 104b, and the selection of which of the first side 104a or the second side 104b may be the hot or the cold side.

In other embodiments where the TEM first side 104a is the hot side, coolant leaving the TEM 104 may be heated coolant that is at a higher temperature than it was before reaching the TEM first side 104a. In embodiments where the TEM second side 104b is a cold side, the coolant leaving the TEM 104 may be at a lower temperature and/or may have a lower vapor content compared to the coolant before it reached the TEM second side 104b.

In addition, by using one or more embodiments, the need for inlet air for cooling components in a housing may be reduced, which may result in lower fan speeds and lower power usage. In addition, lower fan speeds may reduce fan vibration, which may reduce rotational vibration interference (RVI) in the hard drives, which may improve hard drive performance.

Figure 2:
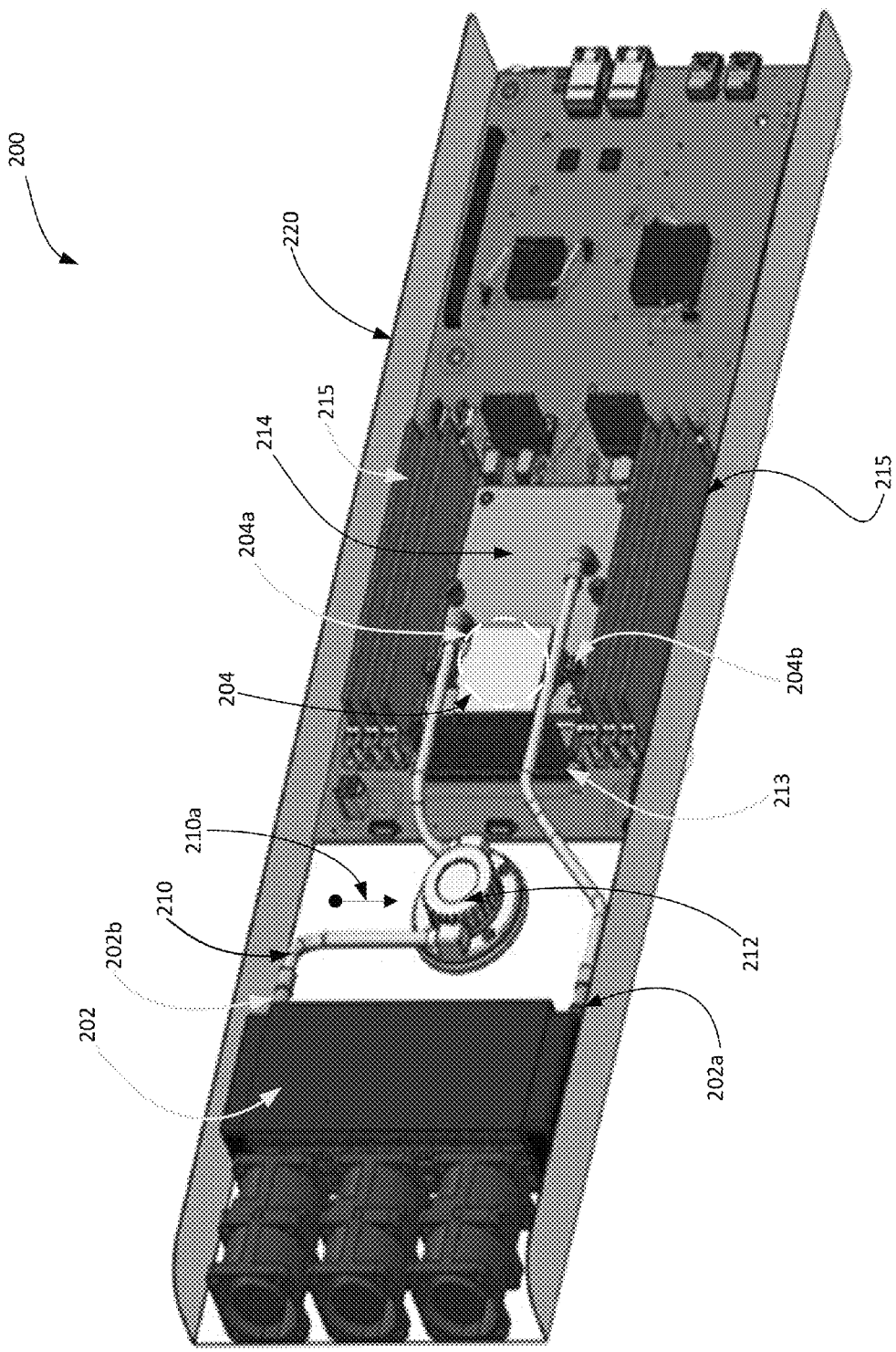
FIG. 2 illustrates an example of an implementation of a tunable pumped two-phase liquid cooling thermal management system in a chassis, in accordance with some embodiments.

FIG. 2 illustrates an example of an implementation of a tunable pumped two-phase liquid cooling thermal management system on a substrate, in accordance with some embodiments. Diagram 200 shows an embodiment of a cold plate 214, which may be similar to cold plate 114 of FIG. 1, through which dielectric coolant is pumped by pump 212, which may be similar to pump 112 of FIG. 1. A processor 213 underneath the cold plate 214 may be thermally managed by being thermally coupled to the cold plate 214.

Diagram 200 shows one embodiment of a tunable PLMC LEAC embodiment in a reference chassis 220 that may be a half-width 1U form factor. The HEX 202, which may be similar to the HEX 102 as shown in FIG. 1, has a coolant outlet 202b, which may be similar to the coolant outlet 102b as shown in FIG. 1, that is connected to a tube 210 that may carry coolant in a flow direction 210a. The HEX 202 may be used to cool the coolant flowing into coolant inlet 202a, which may be similar to coolant inlet 102a as shown in FIG. 1.

Pump 212, which may be similar to pump 112 of FIG. 1, may pump the coolant, which may be liquid, vapor, and/or a combination of liquid and vapor, to the TEM 204, which may be similar to the TEM 104 of FIG. 1. The coolant may be thermally coupled with the TEM cold side 204a, which may be similar to the TEM cold side 104a as shown in FIG. 1. This is described in greater detail in FIG. 3. After flowing through the TEM 104, the additionally-cooled coolant may then flow to the cold plate 214.

The cold plate 214 may be thermally coupled to a processor 213, or, in a non-limiting example to a heat sink attached to the processor (not shown), to cool the processor. In embodiments, the cold plate 214 may be thermally coupled to other areas connected to chassis 220 to be cooled. Non-limiting examples of these areas may include: memory 215, other circuitry, heat sinks, graphics processor units, dielectric material, radio frequency (RF) circuitry, the baseband circuitry, the application circuitry, modem circuitry, light emitting diodes (LED), and the like. In embodiments, cold plate 214 may be used in conjunction with an air-circulating device (not shown) to cool the ambient air temperature in or around the chassis 220.

The warmed coolant may then flow from the cold plate 214 to the TEM 104 where the coolant may be thermally coupled with the TEM hot side 204b. The additionally-warmed coolant may then flow to the HEX input 202a, which may be similar to the HEX input 102a of FIG. 1. In embodiments, the coolant may bypass thermal coupling with the TEM cold side 204a, and/or the coolant may bypass thermal coupling with the TEM hot side 204b.

Figure 3:
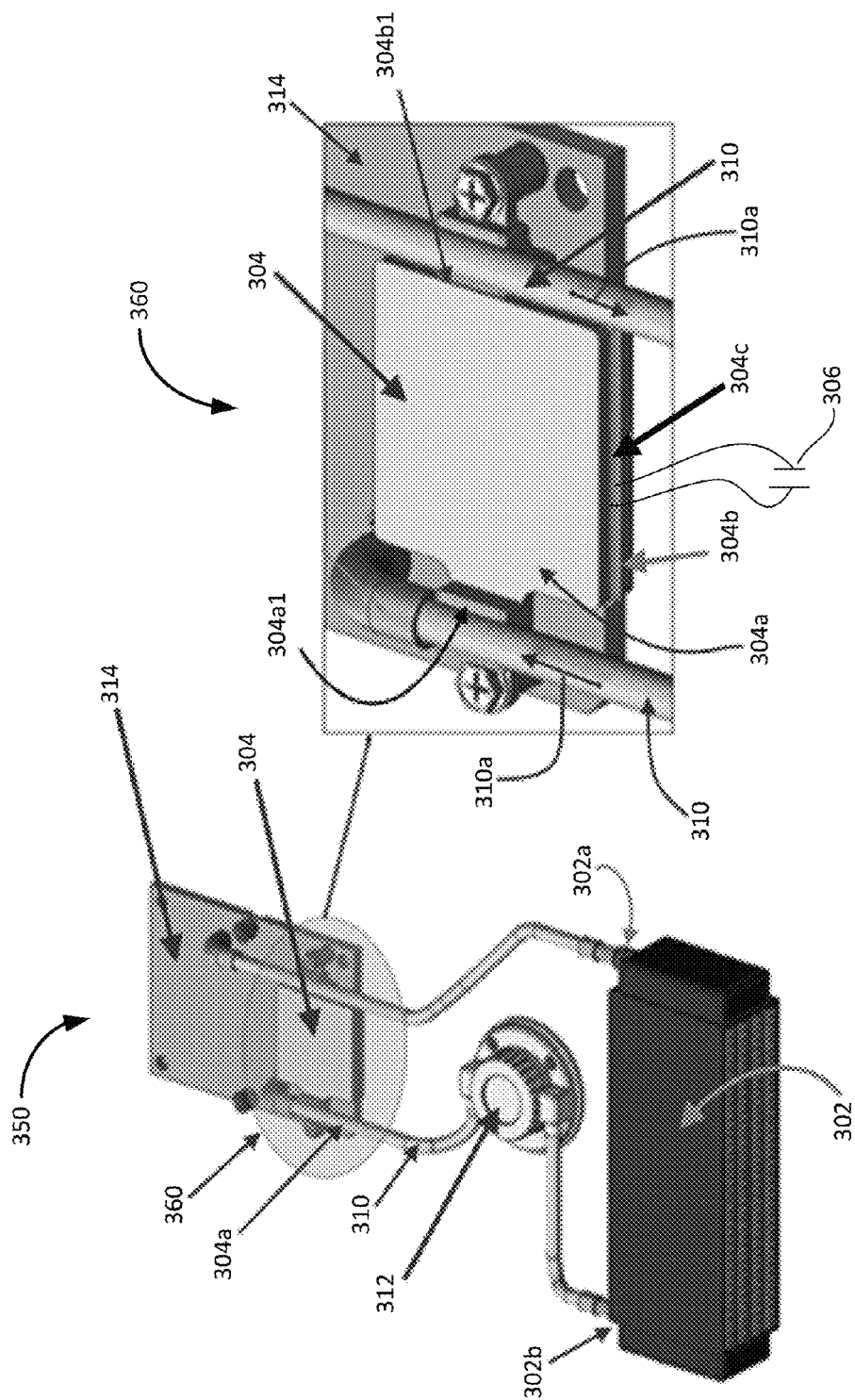
FIG. 3 illustrates a zoomed-in view of components of a tunable pumped two-phase liquid cooling thermal management system, in accordance with some embodiments.

FIG. 3 illustrates a zoom-in view of components of a tunable pumped two-phase liquid cooling thermal management system, in accordance with some embodiments. Diagram 350 shows an illustration of the tunable pumped two-phase liquid cooling thermal management system. In embodiments, coolant may be pumped by pump 312, which may be similar to pump 212 shown in FIG. 2, from the HEX 302, which may be similar to the HEX 202 shown in FIG. 2, to the TEM 304, which may be similar to TEM 204 as shown in FIG. 2. The coolant may then travel to the cold plate 314, which may be similar to cold plate 214 as shown in FIG. 2. The coolant may then flow from the cold plate 314 back to the HEX 302.

In embodiments, a plurality of cold plates (not shown) may be attached using tubes 210 in series or parallel to cool a plurality of processors where, in a non-limiting example, a second processor in the series may become cooler than the first processor in the series. As the coolant flows from a first cold plate thermally coupled to the first processor to the second cold plate thermally coupled to the second processor, the quality of coolant (the vapor content) may increase. This may also increase the effective heat transfer coefficient. In embodiments, the junction temperature of the second processor may be lowered by the fluid temperature gain in the processor node. In non-limiting the examples, this temperature gain may be greater than 5° C.

In embodiments, when a processor 213 is operating in turbo mode or in dynamic operation, for example when there is an increase or decrease in the workload of the processor, the temperature of the series of cold plates (not shown) and the processors thermally coupled to the cold plates may remain the same (isothermal). In addition, there may not be any thermal energy swings, therefore reducing thermal stresses on the processors and increasing reliability of processors. In embodiments, this may be the opposite behavior of air or single-phase cooling systems, where successive cold plates attached to successive processors may become successively warmer.

In embodiments, when processors are upgraded to a newer generation of technology, the one or more cold plates may be readily adapted with higher thermal transfer rates. In embodiments, the attachment mechanisms may be the same for the processors, in one non-limiting example socket-P to socket-P.

Diagram 360 shows a detailed view of the interaction of the coolant traveling in a tube 310 and how the coolant may interact with the TEM 304.

Another application of the proposed technology is as follows. One can achieve higher density at the platform level by using high-power processors in a shadowed configuration. Due to heat of vaporization in PLMC, both processor junction temperatures may be maintained at lower temperatures. In embodiments, both processors' temperatures may be reduced by using a TEM 304 in one or more embodiments.

Figure 4:
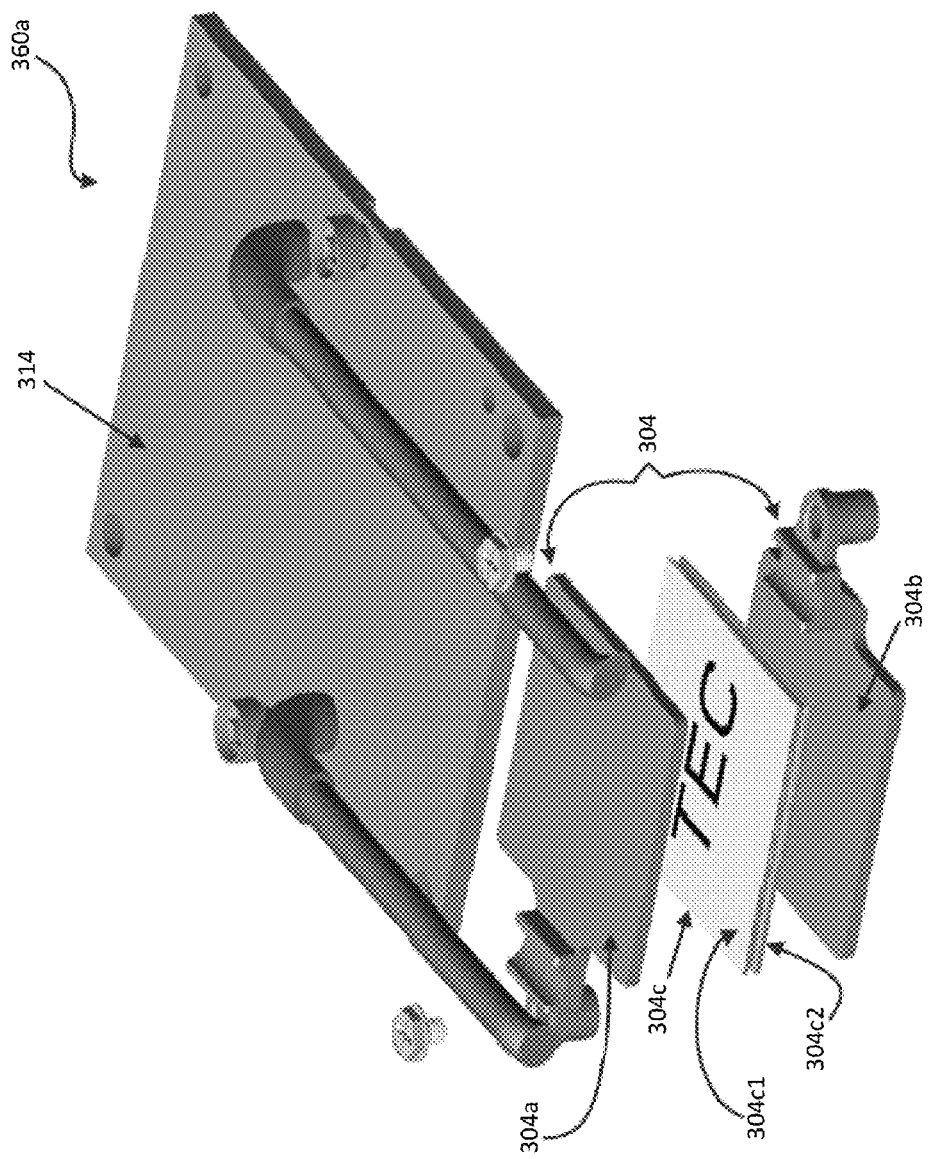
FIG. 4 illustrates an exploded view of a thermoelectric module, in accordance with some embodiments.

FIG. 4 illustrates an exploded view of a thermoelectric module, in accordance with some embodiments. Diagram 360a is an exploded view of the portion of diagram 360 on FIG. 3 having TEM 304. TEM 304 may include an upper block 304a making up a TEM first side, and a lower block 304b making up a TEM second side. In embodiments, these blocks may be copper solid blocks, aluminum solid blocks, and/or other suitable thermal conductive material.

In embodiments, a thermoelectric cooler (TEC) 304c may be sandwiched between the upper block 304a and the lower block 304b. The TEC 304c may have a first side 304c1 and a second side 304c2, and electric inputs from a power source 306, which may be similar to 106 of FIG. 1. In embodiments, the power source may be configured so that the first side 304c1 may be a hot side, and the second side 304c2 may be a cold side, or vice versa.

Figure 5:
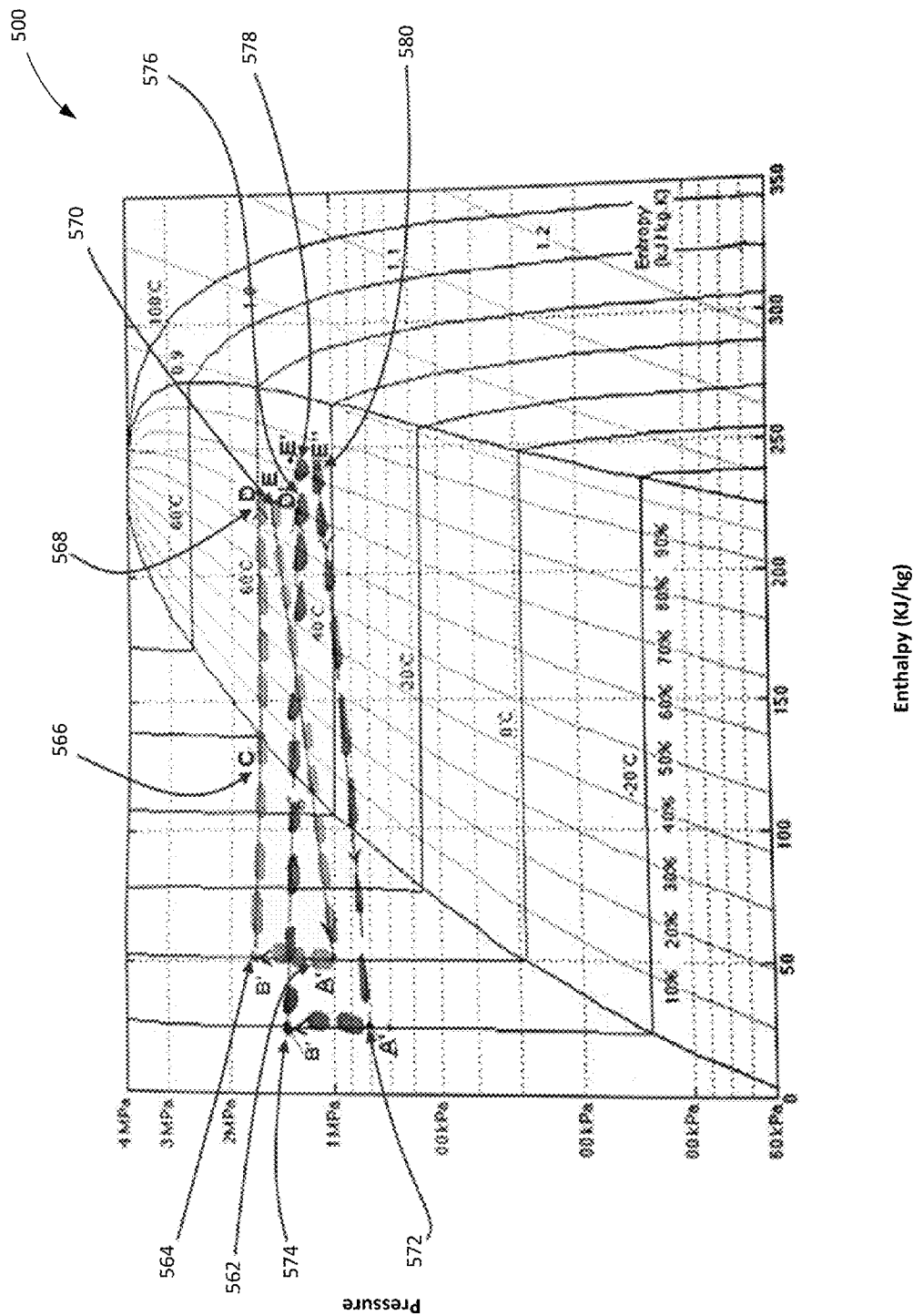
FIG. 5 illustrates a P-H diagram for legacy PLMC and a PLMC implementation, in accordance with some embodiments.

FIG. 5 illustrates a P-H diagram for legacy PLMC and a PLMC implementation of the present disclosure, in accordance with some embodiments. More specifically, diagram 500 contrasts an embodiment of the thermodynamic principal of an advanced tunable PLMC operating loop of the present disclosure with a legacy PLMC implementation. In a non-limiting example, a first cycle: A 562-B 564-C 566-D 568-E 570-A 562 shows the results of an implementation of a legacy PLMC loop. A second cycle: A' 572-B' 574-D' 576-E' 578-E" 580-A' 572 show the results of an embodiment of tunable pumped two-phase liquid cooling thermal management of the present disclosure.

In the first legacy cycle A 562-B 564-C 566-D 568-E 570-A 562, the A 562-B 564 path may be coolant flowing through pump 112. The B 564-C 566 path is the sensible heating of fluid passing through the cold plate 114. The C 566-D 568 path may be latent heat of coolant passing through the cold plate 114. The D 568-E 570 path may be the heat loss through tubing 110 from the cold plate 114 to the HEX 102 inlet, which may be minimal in some applications. The E 570-A 562 path may be the heat loss through the HEX 102 to ambient air, or other medium through which the HEX 102 may transfer thermal energy. In the diagram 500, the flow rate through the cold plate 114 may be designed such that the vapor quality of the coolant may be at 70% near point D 568 of the C 566-D 568 path to avoid any dry out condition in the cold plate.

The second cycle, representing results of an embodiment of tunable pumped two-phase liquid cooling thermal management represented as A' 572-B' 574-D' 576-E' 578-E" 580-A' 572 shows a difference from the first legacy cycle described above. The shift of point A 562 to A' 572 may be due to added extra sub-cooling from the TEM 104. The shift of point D 568 to E' 578 as the vapor quality increased to the HEX inlet 102a may be due to TEM 104 heat transferred into the coolant. The net effect may be that the heat dissipated through the HEX 102 is greater; however, the cold plate 114 operating point may be reduced. As a result, the case temperature or the junction temperature of the component cooled by the cold plate 114, such as a processor, may be reduced.

Figure 6:
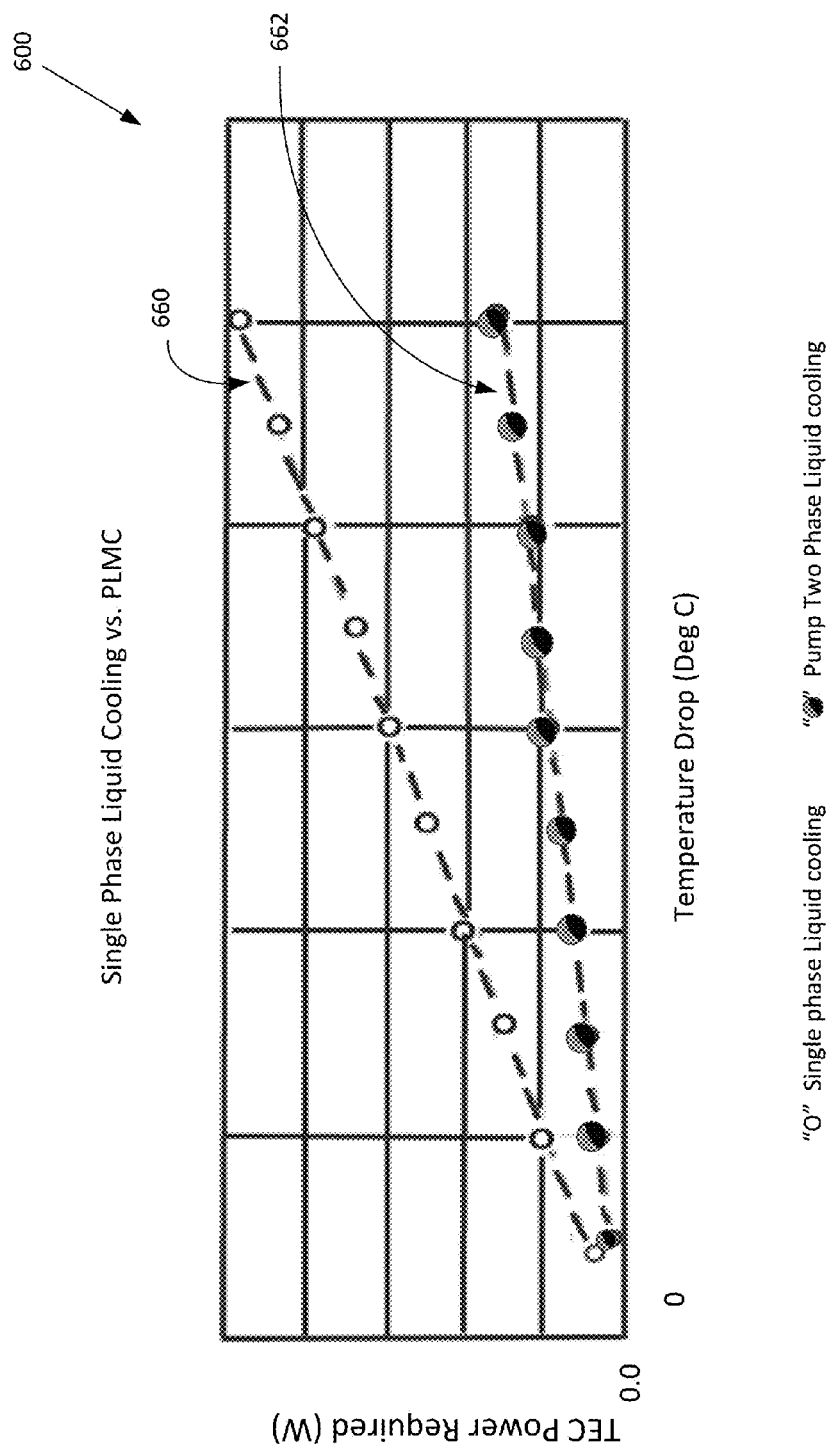
FIG. 6 illustrates energy requirements for thermoelectric cooling devices to lower inlet fluid temperature and processor case temperature, in accordance with some embodiments.

FIG. 6 illustrates energy requirements for thermoelectric cooling devices to lower inlet fluid temperature and processor case temperature, in accordance with some embodiments. Diagram 600 shows one non-limiting example of a hypothetical or analytically derived comparison between single-phase liquid cooling and tunable pumped two-phase liquid cooling thermal management of the present disclosure used to thermally manage a 400 W processor by applying power to a TEM 104.

The first line 660 may represent the relationship between TEM 104 power (x axis) and a drop in temperature in degrees Celsius (y axis) for legacy single-phase cooling. The second line 662 may represent the relationship between TEM 104 power (x axis) and a drop in temperature in degrees Celsius (y axis) for an embodiment of tunable pumped two-phase liquid cooling thermal management. In embodiments, the coefficient of performance may be assumed to be 1.

From the diagram 600, if a 400 W TDP processor is to be cooled further, it may take almost 3.2 times the power for single-phase liquid cooling to do the same. If two processors are in-line, then the energy required may be almost 4 times the power.

In embodiments, an effective heat transfer coefficient (HTC) as high as 60,000 $W/m^2K$ may be achieved on the cold plate 114. In a non-limiting example, to bring the temperature further down by 5° C. by using a TEM 104 may be regarded as a very high corresponding heat transfer. In other non-limiting examples, this temperature reduction may be an order of magnitude higher.

Figure 7:
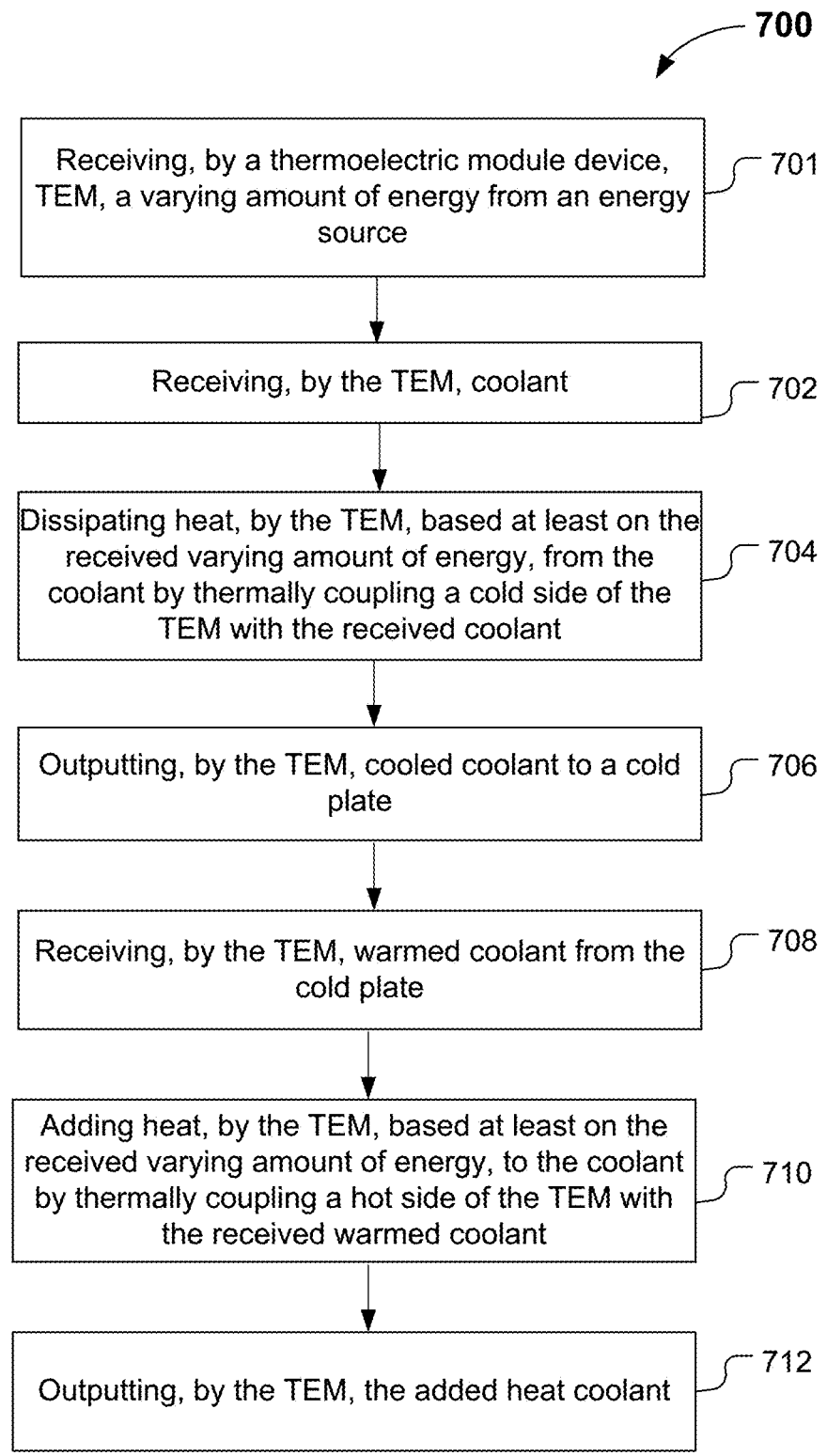
FIG. 7 illustrates a block diagram of a process for implementing a tunable pumped two-phase liquid cooling thermal management system, in accordance with some embodiments.

FIG. 7 illustrates a block diagram of a process for implementing a tunable pumped two-phase liquid cooling thermal management system, in accordance with some embodiments. In some embodiments, the TEM 104 and power supply 106 of FIG. 1 may perform one or more processes, such as the process 700 described herein.

At block 701, the process may receive, by a TEM, a varying amount of energy from an energy source. In embodiments, the energy source may be the electrical source 106 of FIG. 1. In embodiments, the energy source may be direct current (DC).

At block 702, the process may receive, by a TEM, coolant. In embodiments, this coolant may flow through a tube 110 to the TEM 104. In embodiments, the coolant may be received from an HEX 102, a condenser (not shown), or from any other suitable device.

At block 704, the process may dissipate heat, by the TEM, based at least on the received varying amount of energy, from the coolant by thermally coupling a cold side of the TEM with the received coolant. In embodiments, the coolant, when flowing proximate to the TEM 104, may be thermally coupled to the TEM cold side 104a, resulting in heat dissipating from the coolant.

At block 706, the process may output cooled coolant to a cold plate. In embodiments, the coolant may flow from the TEM 104 to the input manifold of a cold plate 114a.

At block 708, the process may receive, by the TEM, warmed coolant from the cold plate. In embodiments, the coolant may flow from the output manifold of a cold plate 114b, and the coolant.

At block 710, the process may add heat, by the TEM, based at least on the received varying amount of energy, to the coolant by thermally coupling a hot side of the TEM with the received warmed coolant. In embodiments, the coolant, when flowing proximate to the TEM hot side 104b, will absorb heat.

At block 712, the process may output, by the TEM, the added heat coolant. In embodiments, this coolant may then flow to the HEX 102, to a condenser, or to some other appropriate device.

Figure 8:
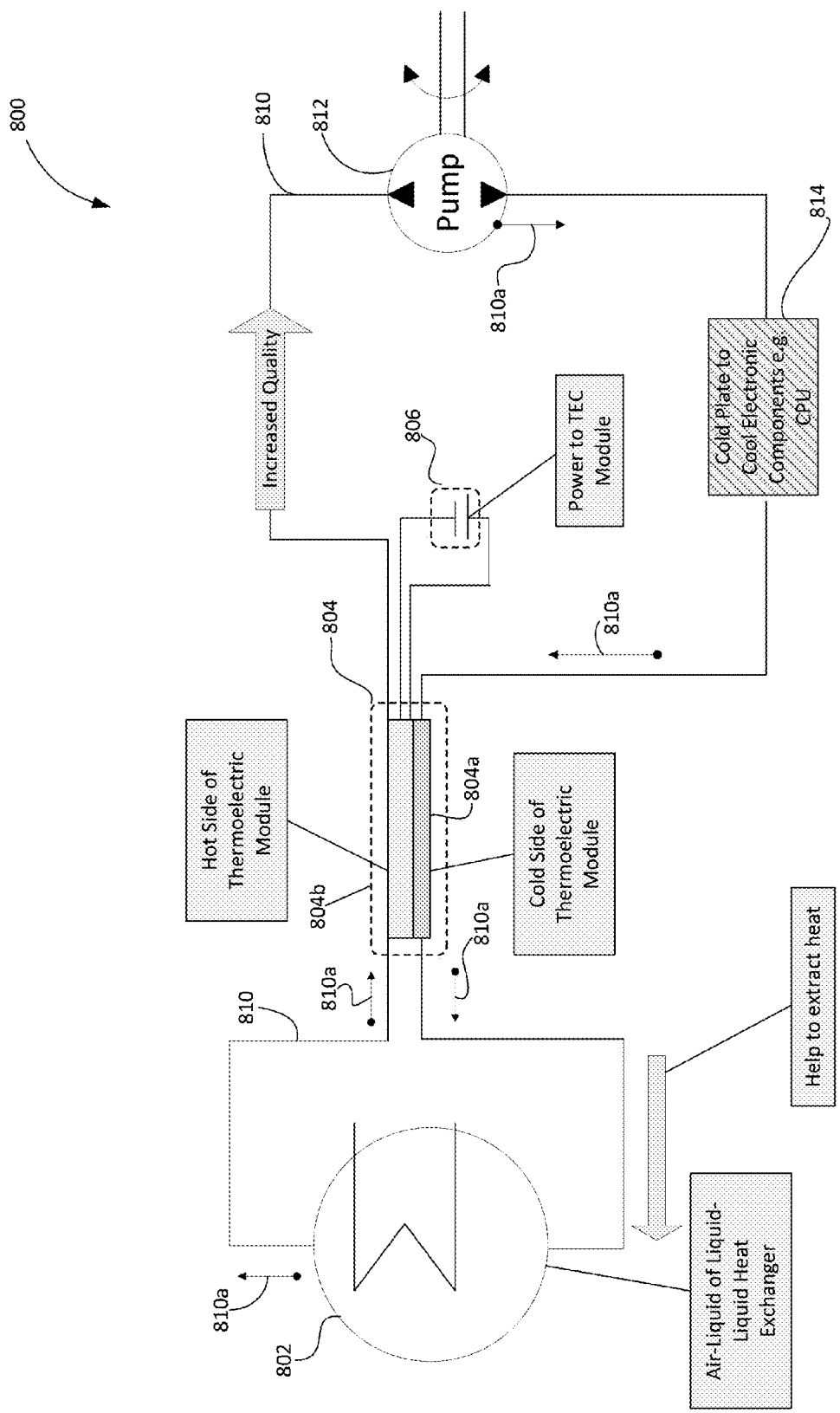
FIG. 8 is a diagram of an alternative tunable pumped two-phase liquid cooling thermal management system, in accordance with some embodiments.

FIG. 8 is a diagram of an alternative tunable pumped two-phase liquid cooling thermal management system, in accordance with some embodiments. Diagram 800 shows another embodiment that is similar to the embodiment shown in diagram 100 of FIG. 1; however, the TEM 804, which may be similar to the TEM 104 of FIG. 1, has hot and cold plates reversed with respect to coolant flow. In embodiments, this may be done by using sensor-based and/or software programmable switches. In embodiments, this may be done by reversing the polarity of DC power source 806, which may be similar to power source 106 of FIG. 1.

In embodiments, coolant may flow from the HEX 802, which may be similar to the HEX 102 of FIG. 1, to the TEM hot side 804b, which may be similar to the TEM hot side 104b of FIG. 1, which may then cause the coolant to absorb heat, and therefore increase the amount of vapor in the coolant, which may be referred to as increasing coolant quality. The coolant may then flow through to 810, which may be similar to two 110 of FIG. 1, to pump 812, which may be similar to pump 112 of FIG. 1.

After leaving the cold plate 814, which may be similar to the cold plate 114 of FIG. 1, the coolant may flow to the TEM cold side 804a, which may be similar to cold side 104a of FIG. 1, at which the coolant may defuse heat. The coolant may then flow from the TEM cold side 804a to the HEX 802.

This embodiment and related embodiments may be used when a cooling solution is deployed in a hot air ambient environment where the heat load on the processor is not very high, for example a 400 W processor. The energy may be then used to cool the mixture going to the HEX 802 that will help to reduce the preheating of air flowing over other components. In embodiments, as the air temperature is higher than incoming ambient air, there is no chance of condensation at the TEM. In embodiments, this cooling technology may be tunable to platform or system requirements.

Other embodiments may be used in a different application, for example a high temperature application. In this example, when the ambient temperature is hot enough to cool the electronic components, polarity of the power source 806 may be changed, to introduce a little cooler air while maintaining the junction temperatures for lower power processors as well.

Figure 9:
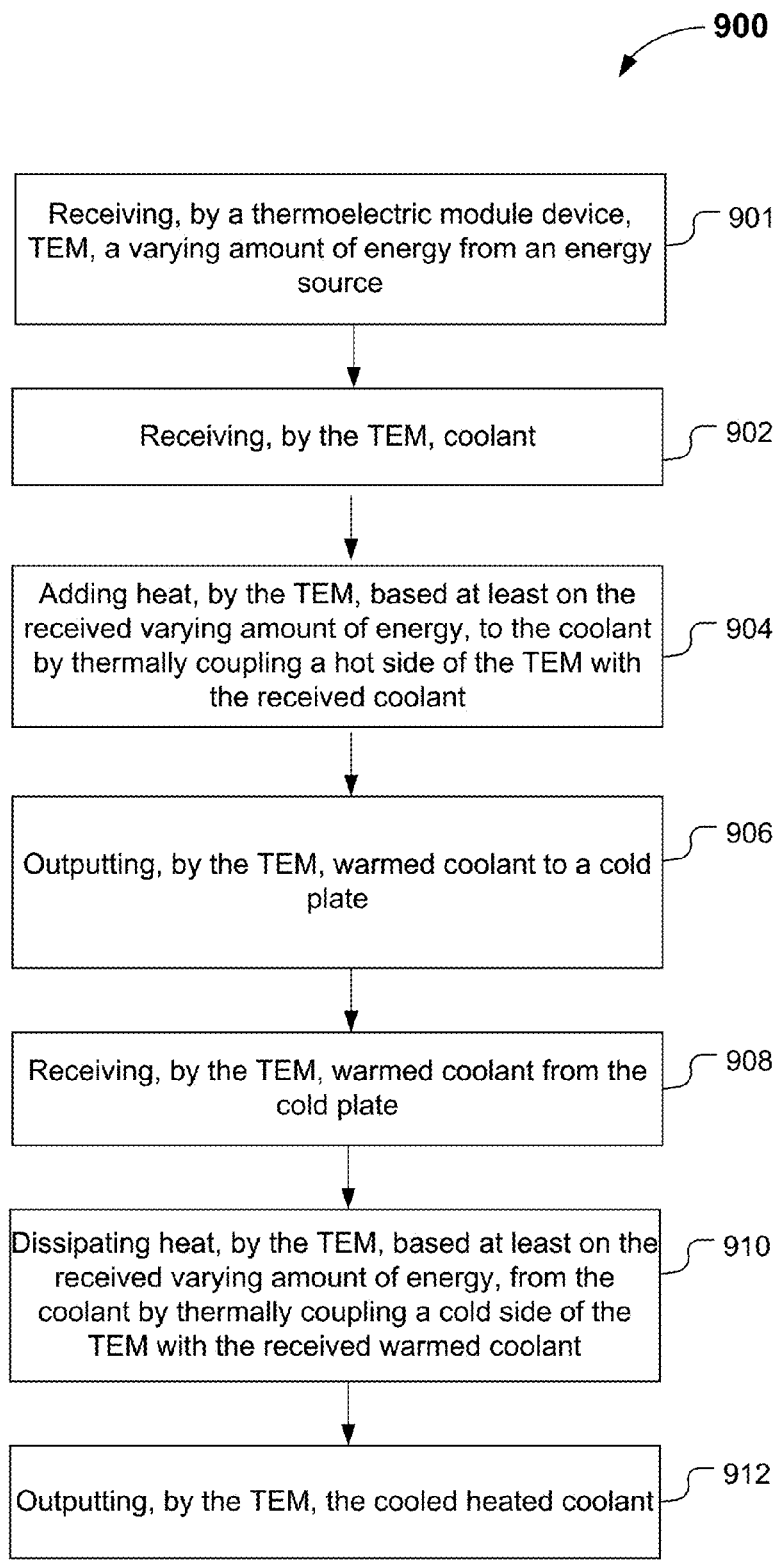
FIG. 9 illustrates a block diagram of an alternative process for implementing a tunable pumped two-phase liquid cooling thermal management system, in accordance with some embodiments.

FIG. 9 illustrates a block diagram of an alternative process for implementing a tunable pumped two-phase liquid cooling thermal management system, in accordance with some embodiments. The TEM 804 and power supply 806 of FIG. 8 may perform one or more processes, such as the process 900 described herein.

At block 901, the process may receive, by a TEM, a varying amount of energy from an energy source.

At block 902, the process may receive, by a TEM, coolant. In embodiments, this coolant may flow through a tube 110 to the TEM 104. In embodiments, the coolant may be received from an HEX 102, a condenser (not shown), or from any other suitable device.

At block 904, the process may add heat, by the TEM, based at least on the received varying amount of energy, to the coolant by thermally coupling a hot side of the TEM with the received coolant. In embodiments, the coolant, when flowing proximate to the TEM hot side 804b, will add heat to the coolant.

At block 906, the process may output, by the TEM, warmed coolant to a cold plate.

At block 908, the process may receive, by the TEM, warmed coolant from the cold plate.

At block 910, the process may dissipate heat, by the TEM, based at least on the received varying amount of energy, from the coolant by thermally coupling a cold side of the TEM with the received warmed coolant.

At block 912, the process may output, by the TEM, the cooled heated coolant.

Various operations are described as multiple discrete operations in turn, in a manner that is most helpful in understanding the claimed subject matter. However, the order of description should not be construed as to imply that these operations are necessarily order dependent.

EXAMPLES

According to various embodiments, the present disclosure describes a number of embodiments related to devices, systems, and methods for a rackmount computing chassis and/or rackmount computing cabinet having a first mounting space to receive a first subset of rack components in a first orientation, and a second mounting space to receive the second subset of rack components in a second orientation that differs from the first orientation. Set forth below are numerous examples and implementations of the embodiments.

Example 1 may be a tunable cooling apparatus, comprising: a thermoelectric module device, TEM, having a hot side and a cold side, and coupled to an energy source; wherein the cold side is to cool a coolant in a first of a plurality of phases enroute to an inlet manifold of a cold plate before the coolant enters the inlet manifold, and the hot side is to warm the coolant in a second of the plurality of phases enroute from an outlet manifold of the cold plate after the coolant flows through the cold plate and exits the outlet manifold; and wherein the TEM is to variably receive an amount of energy from the energy source to variably control a first temperature of the TEM hot side and a second temperature of the TEM cold side.

Example 2 may include the subject matter of example 1, wherein the coolant is in either a liquid state or in a vapor state.

Example 3 may include the subject matter of example 1, wherein the coolant exits from the outlet manifold of the cold plate has a first vapor content value, and the coolant warmed by the TEM hot side has a second vapor content value, wherein the first vapor content value is less than the second vapor content value.

Example 4 may include the subject matter of example 1, further comprising the energy source, wherein the energy source is an electrical energy source to variably provide an amount of electrical energy to variably control the first temperature of the TEM hot side and the second temperature of the TEM cold side.

Example 5 may include the subject matter of any examples 1-4, further comprising a pump coupled with the TEM to pump the coolant towards the inlet manifold of the cold plate, and away from the outlet manifold of the cold plate.

Example 6 may include the subject matter of example 5, wherein the cold plate is thermally coupled to a processor chip.

Example 7 may include the subject matter of example 1, wherein the apparatus further comprises a heat exchanger module having an inlet and an outlet, coupled with the TEM, to receive coolant warmed by the TEM hot side and send cooled coolant to the inlet manifold of the cold plate via the TEM.

Example 8 may include the subject matter of example 1, wherein the TEM further comprises: a thermoelectric cooler, TEC, coupled to the energy source, wherein the TEC has a TEC cold side and a TEC hot side; a first block coupled to the TEC cold side; and a second block coupled to the TEC hot side.

Example 9 may include the subject matter of Example 8, wherein the first block or the second block is a solid block of aluminum or a solid block of copper.

Example 10 may be a method of tuning cooling, comprising: receiving, by a thermoelectric module device, TEM, a varying amount of energy from an energy source; receiving, by the TEM, coolant; dissipating heat, by the TEM, based at least on the received varying amount of energy, from the coolant by thermally coupling a cold side of the TEM with the received coolant; outputting, by the TEM, cooled coolant to a cold plate; receiving, by the TEM, warmed coolant from the cold plate; adding heat, by the TEM, based at least on the received varying amount of energy, to the coolant by thermally coupling a hot side of the TEM with the received warmed coolant; and outputting, by the TEM, the added heat coolant.

Example 11 may include the subject matter of Example 10, wherein adding heat to the coolant comprises causing the coolant to increase its vapor content.

Example 12 may include the subject matter of Example 10, further comprising controlling, by circuitry coupled to the TEM, the varying amount of electrical energy to the TEM received from the energy source.

Example 13 may include the subject matter of Example 12, wherein electrical energy is in the form of direct current, DC.

Example 14 may be a tunable cooling apparatus, comprising: a thermoelectric module device, TEM, having a hot side and a cold side, and coupled to an energy source; wherein the hot side is to heat a coolant in a first of a plurality of phases enroute to an inlet manifold of a cold plate before the coolant enters the inlet manifold, and the cold side is to cool the coolant in a second of the plurality of phases enroute from an outlet manifold of the cold plate after the coolant flows through the cold plate and exits the outlet manifold; and wherein the TEM is to variably receive an amount of energy from the energy source to variably control a first temperature of the TEM hot side and a second temperature of the TEM cold side.

Example 15 may include the subject matter of Example 14, wherein the coolant is in either a liquid state or in a vapor state.

Example 16 may include the subject matter of Example 14, wherein the coolant exits from the outlet manifold of the cold plate has a first vapor content value, and the coolant warmed by the TEM hot side has a second vapor content value, wherein the first vapor content value is greater than the second vapor content value.

Example 17 may include the subject matter of Example 14, further comprising the energy source, wherein the energy source is an electrical energy source to variably provide an amount of electrical energy to variably control the first temperature of the TEM hot side and the second temperature of the TEM cold side.

Example 18 may include the subject matter of examples 14-17, further comprising a pump coupled with the TEM to pump the coolant towards the inlet manifold of the cold plate, and away from the outlet manifold of the cold plate.

Example 19 may include the subject matter of example 18, wherein the cold plate is thermally coupled to a processor chip.

Example 20 may include the subject matter of example 14, wherein the apparatus further comprises a heat exchanger module having an inlet and an outlet, coupled with the TEM, to receive coolant warmed by the TEM hot side and send cooled coolant to the inlet manifold of the cold plate via the TEM.

Example 21 may include the subject matter of example 14, wherein the TEM further comprises: a thermoelectric cooler, TEC, coupled to the energy source, wherein the TEC has a TEC cold side and a TEC hot side; a first block coupled to the TEC cold side; and a second block coupled to the TEC hot side.

Example 22 may include the subject matter of example 21, wherein the first block or the second block is a solid block of aluminum or a solid block of copper.

Example 23 may be a method of tuning cooling, comprising: receiving, by a thermoelectric module device, TEM, a varying amount of energy from an energy source; receiving, by the TEM, coolant; adding heat, by the TEM, based at least on the received varying amount of energy, to the coolant by thermally coupling a hot side of the TEM with the received coolant; outputting, by the TEM, warmed coolant to a cold plate; receiving, by the TEM, warmed coolant from the cold plate; dissipating heat, by the TEM, based at least on the received varying amount of energy, from the coolant by thermally coupling a cold side of the TEM with the received warmed coolant; and outputting, by the TEM, the cooled heated coolant.

Example 24 may include the subject matter of example 23, wherein adding heat to the coolant comprises causing the coolant to increase its vapor content.

Example 25 may include the subject matter of example 24, further comprising controlling, by circuitry coupled to the TEM, the varying amount of the electrical energy to the TEM received from the energy source, to vary the temperature of the cold side of the TEM and the hot side of the TEM.

Example 26 may include the subject matter of example 25, wherein electrical energy is in the form of direct current, DC.

Example 27 may be an apparatus for tuning cooling, comprising: means for receiving a varying amount of energy from an energy source; means for receiving coolant; means for dissipating heat, based at least on the received varying amount of energy, from the coolant; means for outputting cooled coolant to a cold plate; means for receiving warmed coolant from the cold plate; means for adding heat based at least on the received varying amount of energy, to the coolant; and means for outputting the added heat coolant.

Example 28 may be the apparatus of example 27, or of any other example herein, wherein means for adding heat to the coolant comprises means for causing the coolant to increase its vapor content.

Example 29 may be the apparatus of example 27, or of any other example herein, further comprising means for controlling the varying amount of electrical energy to a thermoelectric module, TEM, received from an energy source.

Example 30 may be the apparatus of example 29, or of any other example herein, wherein electrical energy is in the form of direct current, DC.

Example 31 may be an apparatus for tuning cooling, comprising: means for receiving a varying amount of energy from an energy source; means for receiving coolant; means for adding heat, based at least on the received varying amount of energy, to the coolant; means for outputting warmed coolant to a cold plate; means for receiving warmed coolant from the cold plate; means for dissipating heat based at least on the received varying amount of energy, from the coolant; and means for outputting the cooled heated coolant.

Example 32 may be the apparatus of example 31, or of any other example herein, wherein means for adding heat to the coolant comprises means for causing the coolant to increase its vapor content.

Example 33 may be the apparatus of example 32, or of any other example herein, further comprising means for controlling the varying amount of the electrical energy to a thermoelectric module, TEM, received from an energy source, to vary the temperature of a cold side of the TEM and a hot side of the TEM.

Example 34 may be the apparatus of example 33, or of any other example herein, wherein electrical energy is in the form of direct current, DC.

Example 35 may be a tunable cooling apparatus, comprising: a thermoelectric module device, TEM, having a hot side and a cold side, and coupled to an energy source; wherein the cold side is to cool a coolant enroute to an inlet manifold of a cold plate before the coolant enters the inlet manifold, and the hot side is to warm the coolant enroute from an outlet manifold of the cold plate after the coolant flows through the cold plate and exits the outlet manifold; and wherein the TEM is to variably receive an amount of energy from the energy source to variably control a first temperature of the TEM hot side and a second temperature of the TEM cold side.

Example 36 may include the apparatus of example 35, or of any other example herein, wherein the coolant is in a liquid state, a vapor state, or in a combination liquid and vapor state.

Example 37 may include the apparatus of example 35, or of any other example herein, wherein the coolant exits from the outlet manifold of the cold plate has a first vapor content value, and the coolant warmed by the TEM hot side has a second vapor content value, wherein the first vapor content value is less than the second vapor content value.

Example 38 may include the apparatus of example 35, or of any other example herein, further comprising the energy source, wherein the energy source is an electrical energy source to variably provide an amount of electrical energy to variably control the first temperature of the TEM hot side and the second temperature of the TEM cold side.

Example 39 may include the apparatus of example 35, or of any other example herein, further comprising a pump to pump the coolant towards the inlet manifold of the cold plate, and away from the outlet manifold of the cold plate.

Example 40 may include the apparatus of example 39, or of any other example herein, wherein the cold plate is thermally coupled to a processor.

Example 41 may include the apparatus of example 35, or of any other example herein, wherein the apparatus further comprises a heat exchanger module having an inlet and an outlet, coupled with the TEM, to receive coolant warmed by the TEM hot side and send cooled coolant to the inlet manifold of the cold plate via the TEM.

Example 42 may include the apparatus of example 35, or of any other example herein, wherein the TEM further comprises: a thermoelectric cooler, TEC, coupled to the energy source, wherein the TEC has a TEC cold side and a TEC hot side; a first block coupled to the TEC cold side; and a second block coupled to the TEC hot side.

Example 43 may include the apparatus of example 42, or of any other example herein, wherein the first block or the second block is a solid block of aluminum or a solid block of copper.

Example 44 may include the apparatus of any of examples 35-43, or of any other example herein, wherein the cooling apparatus includes a chassis.

Example 45 may be a method of tuning cooling in a cooling system, comprising: pumping coolant through the cooling system comprising a pump and a thermoelectric module device, TEM; applying electrical energy to a thermoelectric module device, TEM; and varying the applied electrical energy to the TEM to add heat to or to dissipate heat from the pumped coolant.

Example 46 may be the method of example 45, or of any other example herein, further comprising thermally coupling the coolant to a cold plate to dissipate heat from the cold plate.

Example 47 may be the method of example 45, or of any other example herein, wherein adding heat to the coolant comprises causing coolant to increase its vapor content.

Example 48 may be the method of example 45, or of any other example herein, wherein applying electrical energy comprises applying direct current, DC.

Example 49 may be a tunable cooling apparatus, comprising: a thermoelectric module device, TEM, having a hot side and a cold side, and coupled to an energy source; wherein the hot side is to heat a coolant enroute to an inlet manifold of a cold plate before the coolant enters the inlet manifold, and the cold side is to cool the coolant enroute from an outlet manifold of the cold plate after the coolant flows through the cold plate and exits the outlet manifold; and wherein the TEM is to variably receive an amount of energy from the energy source to variably control a first temperature of the TEM hot side and a second temperature of the TEM cold side.

Example 50 may be the apparatus of example 49, or of any other example herein, wherein the coolant is in either a liquid state or in a vapor state.

Example 51 may be the apparatus of example 49, or of any other example herein, wherein the coolant exits from the outlet manifold of the cold plate has a first vapor content value, and the coolant warmed by the TEM hot side has a second vapor content value, wherein the first vapor content value is greater than the second vapor content value.

Example 52 may be the apparatus of example 49, or of any other example herein, further comprising the energy source, wherein the energy source is an electrical energy source to variably provide an amount of electrical energy to variably control the first temperature of the TEM hot side and the second temperature of the TEM cold side.

Example 53 may be the apparatus of example 49, or of any other example herein, further comprising a pump coupled with the TEM to pump the coolant towards the inlet manifold of the cold plate, and away from the outlet manifold of the cold plate.

Example 54 may be the apparatus of example 53, or of any other example herein, wherein the cold plate is thermally coupled to a processor.

Example 55 may be the apparatus of example 49, or of any other example herein, wherein the apparatus further comprises a heat exchanger module having an inlet and an outlet, coupled with the TEM, to receive coolant warmed by the TEM hot side and send cooled coolant to the inlet manifold of the cold plate via the TEM.

Example 56 may be the apparatus of example 49, or of any other example herein, wherein the TEM further comprises: a thermoelectric cooler, TEC, coupled to the energy source, wherein the TEC has a TEC cold side and a TEC hot side; a first block coupled to the TEC cold side; and a second block coupled to the TEC hot side.

Example 57 may be the apparatus of example 56, or of any other example herein, wherein the first block or the second block is a solid block of aluminum or a solid block of copper.

Example 58 may be an apparatus for providing cooling, comprising: means for pumping coolant through a cooling system; means for applying energy to a thermoelectric module device, TEM; and means for varying the applied energy to the TEM to add heat to or to a dissipate heat from the pumped coolant.

Example 59 may be the apparatus of example 58, or of any other example herein, further comprising means for thermally coupling the coolant to a cold plate to dissipate heat from the cold plate.

Example 60 may be an apparatus for tuning cooling, comprising: means for receiving a varying amount of energy from an energy source; means for receiving coolant; means for dissipating heat, based at least on the received varying amount of energy, from the coolant; means for outputting cooled coolant to a cold plate; means for receiving warmed coolant from the cold plate; means for adding heat based at least on the received varying amount of energy, to the coolant; and means for outputting the added heat coolant.

Example 61 may be the apparatus of example 60, or of any other example herein, wherein means for adding heat to the coolant comprises means for causing the coolant to increase its vapor content.

Example 62 may be the apparatus of example 60, or of any other example herein, further comprising means for controlling the varying amount of electrical energy to a thermoelectric module, TEM, received from an energy source.

Example 63 may be the apparatus of example 60, or of any other example herein, wherein electrical energy is in the form of direct current, DC.

Example 64 may be an apparatus for tuning cooling, comprising: means for receiving a varying amount of energy from an energy source; means for receiving coolant; means for adding heat, based at least on the received varying amount of energy, to the coolant; means for outputting warmed coolant to a cold plate; means for receiving warmed coolant from the cold plate; means for dissipating heat based at least on the received varying amount of energy, from the coolant; and means for outputting the cooled heated coolant.

Example 65 may be the apparatus of example 64, or of any other example herein, wherein means for adding heat to the coolant comprises means for causing the coolant to increase its vapor content.

Example 66 may be the apparatus of example 65, or of any other example herein, further comprising means for controlling the varying amount of the electrical energy to a thermoelectric module, TEM, received from an energy source, to vary the temperature of a cold side of the TEM and a hot side of the TEM.

Example 67 may be the apparatus of example 66, or of any other example herein, wherein electrical energy is in the form of direct current, DC.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. A tunable cooling apparatus, comprising:
   a thermoelectric module device, TEM, having a hot side and a cold side, and coupled to an energy source;
   wherein the cold side is to cool a coolant enroute to an inlet manifold of a cold plate before the coolant enters the inlet manifold, and the hot side is to warm the coolant enroute from an outlet manifold of the cold plate after the coolant flows through the cold plate and exits the outlet manifold;
   wherein the TEM is to variably receive an amount of energy from the energy source, based upon a measurement of a vapor content of the coolant exiting the TEM hot side, to variably control a first temperature of the TEM hot side and a second temperature of the TEM cold side; and
   a heat exchanger module having an inlet and an outlet, coupled with the TEM, to receive coolant warmed by the TEM hot side and send cooled coolant to the inlet manifold of the cold plate via the TEM, wherein the warmed coolant received from the TEM hot side has an increased vapor content to cause thermal performance of the heat exchanger module to increase.

2. The apparatus of claim 1, wherein the coolant is in a liquid state, a vapor state, or in a combination liquid and vapor state.

3. The apparatus of claim 1, wherein the coolant exiting from the outlet manifold of the cold plate has a first vapor content value, and the coolant warmed by the TEM hot side has a second vapor content value, wherein the first vapor content value is less than the second vapor content value.

4. The apparatus of claim 1, further comprising the energy source, wherein the energy source is an electrical energy source to variably provide an amount of electrical energy to variably control the first temperature of the TEM hot side and the second temperature of the TEM cold side.

5. The apparatus of claim 1, further comprising a pump to pump the coolant towards the inlet manifold of the cold plate, and away from the outlet manifold of the cold plate.

6. The apparatus of claim 5, wherein the cold plate is thermally coupled to a processor.

7. The apparatus of claim 1, wherein the TEM further comprises:
   a thermoelectric cooler, TEC, coupled to the energy source, wherein the TEC has a TEC cold side and a TEC hot side;
   a first block coupled to the TEC cold side; and
   a second block coupled to the TEC hot side.

8. The apparatus of claim 7, wherein the first block or the second block is a solid block of aluminum or a solid block of copper.

9. The apparatus of claim 1, wherein the cooling apparatus includes a chassis.

10. A method of tuning cooling in a cooling system, comprising:
    pumping coolant through the cooling system comprising a pump and a thermoelectric module device, TEM;
    applying electrical energy to the TEM based upon a measurement of a vapor content of the coolant exiting the TEM hot side; and
    varying the applied electrical energy to the TEM to add heat to the pumped coolant to increase a vapor content of the coolant prior to the coolant entering a heat exchanger to cause thermal performance of the heat exchanger to increase.

11. The method of claim 10, wherein applying electrical energy comprises applying direct current, DC.

12. A tunable cooling apparatus, comprising:
    a thermoelectric module device, TEM, having a hot side and a cold side, and coupled to an energy source;
    wherein the hot side is to heat a coolant enroute to an inlet manifold of a cold plate before the coolant enters the inlet manifold, and the cold side is to cool the coolant enroute from an outlet manifold of the cold plate after the coolant flows through the cold plate and exits the outlet manifold;
    wherein the TEM is to variably receive an amount of energy from the energy source based upon a measurement of a vapor content of the coolant exiting the TEM hot side to variably control a first temperature of the TEM hot side and a second temperature of the TEM cold side; and
    a heat exchanger module having an inlet and an outlet, coupled with the TEM, to receive coolant cooled by the TEM cold side and send cooled coolant to the inlet manifold of the cold plate via the TEM, wherein the received coolant cooled by the TEM cold side is to aid the heat exchanger module in extracting heat from the coolant.

13. The apparatus of claim 12, wherein the coolant exiting from the outlet manifold of the cold plate has a first vapor content value, and the coolant warmed by the TEM hot side has a second vapor content value, wherein the first vapor content value is greater than the second vapor content value.

14. The apparatus of claim 12, further comprising the energy source, wherein the energy source is an electrical energy source to variably provide an amount of electrical energy to variably control the first temperature of the TEM hot side and the second temperature of the TEM cold side.

15. The apparatus of claim 12, further comprising a pump coupled with the TEM to pump the coolant towards the inlet manifold of the cold plate, and away from the outlet manifold of the cold plate.

16. The apparatus of claim 15, wherein the cold plate is thermally coupled to a processor chip.

17. The apparatus of claim 12, wherein the TEM further comprises:
- a thermoelectric cooler, TEC, coupled to the energy source, wherein the TEC has a TEC cold side and a TEC hot side;
- a first block coupled to the TEC cold side; and
- a second block coupled to the TEC hot side.

18. The apparatus of claim 17, wherein the first block or the second block is a solid block of aluminum or a solid block of copper.

\* \* \* \* \*